United States Patent
Schultz et al.

(10) Patent No.: US 6,553,157 B2
(45) Date of Patent: Apr. 22, 2003

(54) OPTOELECTRONIC MICROELECTRONIC SYSTEM

(75) Inventors: Thomas Schultz, München (DE); Wolfgang Rösner, Ottobrunn (DE); Lothar Risch, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/093,320

(22) Filed: Mar. 7, 2002

(65) Prior Publication Data

US 2002/0110329 A1 Aug. 15, 2002

Related U.S. Application Data

(63) Continuation of application No. PCT/DE00/03073, filed on Sep. 6, 2000.

(30) Foreign Application Priority Data

Sep. 7, 1999 (DE) .......................... 199 42 692

(51) Int. Cl.[7] .............. G02B 6/12; G02B 6/36; H01L 33/00
(52) U.S. Cl. ............... 385/14; 385/14; 385/49; 385/88; 257/98; 257/446; 372/50
(58) Field of Search ................ 385/14, 49, 88, 385/130, 131, 132; 438/31, 65; 257/98, 99, 432, 446, 452, 466; 372/45–50

(56) References Cited

U.S. PATENT DOCUMENTS

| 4,744,623 A | * 5/1988 | Prucnal et al. ............. 385/49 |
| 4,970,386 A | 11/1990 | Buck |
| 5,991,487 A | * 11/1999 | Sugiyama ................. 385/129 |
| 6,387,720 B1 | * 5/2002 | Misheloff et al. ........... 438/31 |
| 2002/0047143 A1 | * 4/2002 | Ramdani et al. .......... 257/289 |

FOREIGN PATENT DOCUMENTS

| DE | 26 24 436 | 12/1977 |
| DE | 39 20 219 C2 | 1/1991 |

OTHER PUBLICATIONS

Adams, et al.: "Electrooptical Coupling of Waveguides and VLSI Circuit Integrated on one Silicon Chip", EFOV, 1992, pp. 92–95.
Moreno, et al.: "Photosensor and Optical Waveguide Coupling on Silicon Technology", Elsevier Science S. A. 1997, pp. 524–528.
Fullin, et al.: "CMOS–Based Technology of Integrated Optoelectronics: A Modular Approach", IEEE, 1994, pp. 20.4.1–20.4.4.
Hilleringmann, U. et al.: "Optoelectronic System Integration on Silicon: Waveguides, Photodetectors, and VLSI CMOS Circuits on One Chip", IEEE, 1995, pp. 841–846.
Risch, L. et al.: "Vertical MOS Transistors with 70 nm Channel Length", IEEE, 1996, pp. 1495–1498.
Soole, J. B. D. et al.: "Fast High–Efficiency Integrated Waveguide Photodetectors Using Novel Hybrid Vertical/Butt Coupling Geometry", Applied Physics Letters, No. 1, Jul. 6, 1992, pp. 13–15.

* cited by examiner

*Primary Examiner*—Hemang Sanghavi
(74) *Attorney, Agent, or Firm*—Laurence A. Greenberg; Werner H. Stemer; Ralph E. Locher

(57) ABSTRACT

In an integrated optoelectronic microelectronic system, an optoelectronically active diode part is formed in a semiconductor substrate by zones forming depletion layers. The system is provided in a mesa that stands vertically on a semiconductor substrate and runs in a direction of extension thereof. A light waveguide is optically coupled to the diode part in such a way that light is coupled into the diode part via the mesa side wall.

8 Claims, 2 Drawing Sheets

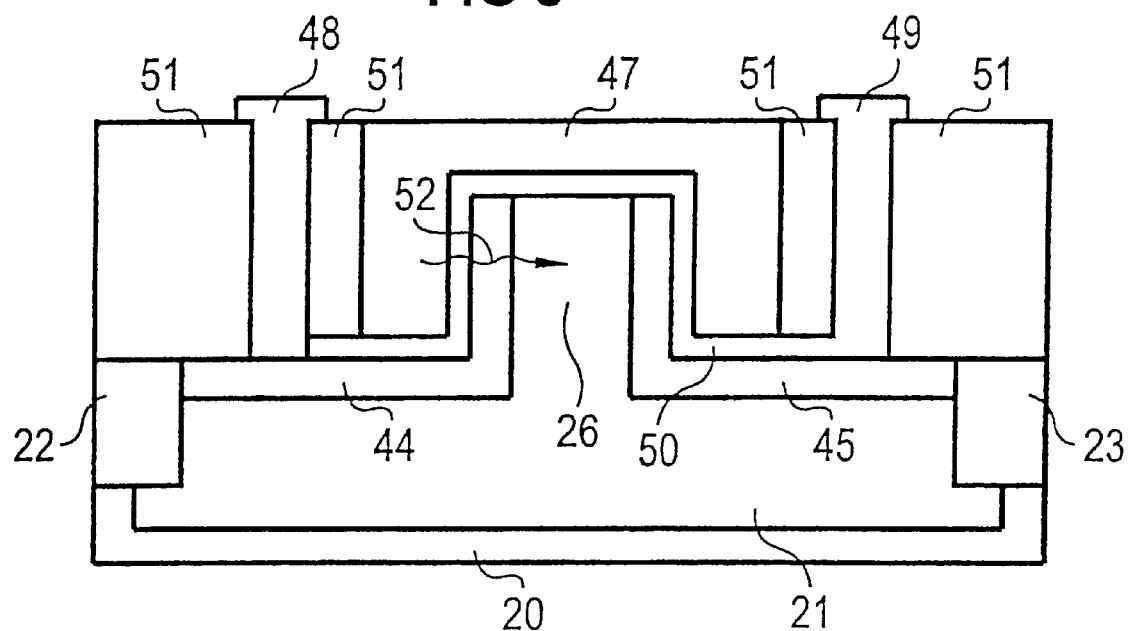
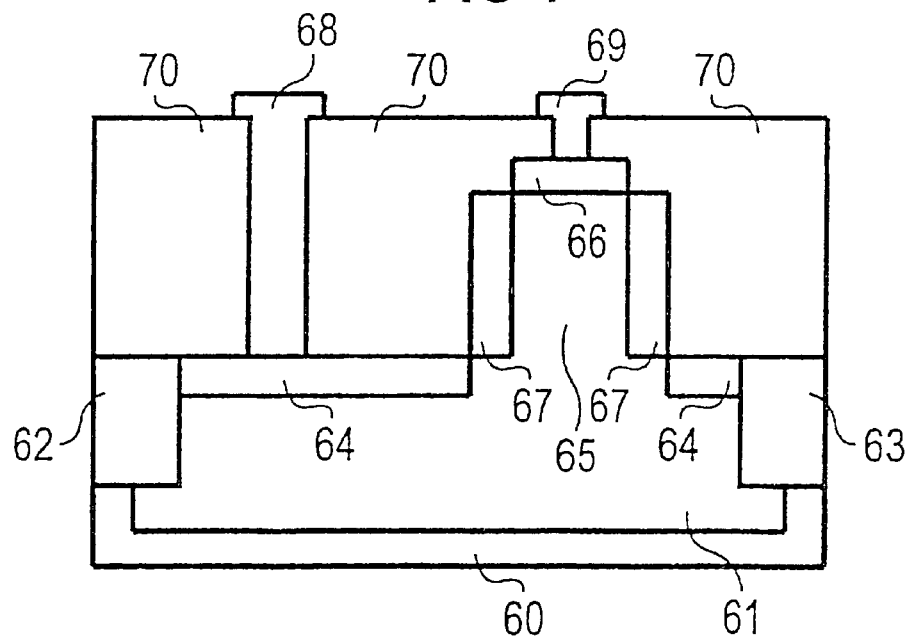

US 6,553,157 B2

OPTOELECTRONIC MICROELECTRONIC SYSTEM

CROSS-REFERENCE TO RELATED APPLICATION

This application is a continuation of copending International Application No. PCT/DE00/03073, filed Sep. 6, 2000, which designated the United States.

BACKGROUND OF THE INVENTION

Field of the Invention

The present invention relates to an optoelectronic microelectronic system.

In microelectronics, alongside purely electronic systems such as integrated semiconductor circuits in which electronic functional units, such as transistors, diodes, capacitors, etc., are integrated in a semiconductor substrate, it has become standard to combine optical elements as well with the electronic functional units. Here, modern semiconductor technology makes it possible to monolithically integrate photosensors, in the form of photodiodes and light waveguides, with electronic systems, such as for example amplifiers. This can for example take place in MOS technology, whereby the process of manufacture of photosensors in the form of photodiodes and light waveguides is compatible with the process of manufacture of the electronic amplifier functional units.

An optoelectronic microelectronic system of the type cited above is known in principle from the reference titled "Microelectronic Engineering" 15 (1991), pp. 289–292. On the basis of an integrated structure in CMOS technology, having an NMOS transistor and a PMOS transistor as well as a photodiode, this reference explains the technology for a monolithic integration.

A known photodiode is formed in a silicon substrate of one conductivity type, having weak doping, e.g. of the p-conductivity type. Trench insulators are provided for insulation against electronic functional units, such as the above-mentioned MOS transistors. The insulators can be what are known as shallow trench isolation (STI) regions with silicon dioxide. In a region between the trench insulators, a first zone having one conductivity type, i.e. for example the p-conductivity type, is provided, as well as a second zone of the opposite conductivity type, i.e. for example the n-conductivity type, the zones having a high doping concentration in comparison with the doping concentration of substrate. The expression "weak doping" used above for the substrate doping thus denotes a low doping concentration in comparison with the doping concentration of zones. A weakly doped zone, which in practice can also be designated an intrinsic zone, is thus located between the first and second zones. If, as is standard, a low doping concentration is designated by a minus sign, and a high doping concentration is designated by a plus sign, then for the above conductivity types, given as examples, for the substrate as well as the zones an optoelectronically active diode part results having the zone sequence: p+-first zone, p⁻-intrinsic zone, and n⁺second zone.

On the substrate having the trench insulators and the zones, a light waveguide is provided that can be made for example of silicon oxide nitride/silicon dioxide. From a light wave running in the light waveguide, light is coupled into the W optoelectronically active diode part through a leaky wave coupling. Of course, light is also coupled in via the regions of the first and second zones. The coupled-in light generates charge bearers in the intrinsic zone, which in turn generate the diode photocurrent.

A photodiode of the type explained above represents a lateral, or planar, diode. In order to enable realization of a good luminous efficacy, and thus a larger photocurrent, the surface of the optoelectronically active diode part must be as large as possible, as seen in the lateral direction. However, this results in that such planar photodiodes in an integrated system require a comparably large chip surface, which has an adverse effect on the integration density. For large-scale-integrated systems, the tendency is towards ever-smaller structures, for example MOS transistors having ever-smaller channel lengths. The chip surface obtained in this way is then at least partially again destroyed through planar photodiodes. This is in particular also an economic disadvantage, because chip surface area is an essential cost factor.

In Published, Non-Prosecuted German Patent Application DE 26 24 436 A1, a photodiode structure is shown in which, in order to improve the light coupling, a structure in the shape of a mesa is fashioned that stands out from a substrate. The light couples into the mesa with its vertical component, so that the degree of coupling is increased. The mesa is formed in an epitaxial layer. A comparable photodiode structure is taught in German Patent DE 39 20 219 C2.

SUMMARY OF THE INVENTION

It is accordingly an object of the invention to provide an optoelectronic microelectronic system which overcomes the above-mentioned disadvantages of the prior art devices of this general type, that saves chip surface area in relation to a predetermined luminous efficacy, and which in addition is compatible with MOS technologies for transistor structures, in particular smaller channel lengths.

With the foregoing and other objects in view there is provided, in accordance with the invention, an optoelectronic microelectronic system. The system contains a semiconductor substrate having a surface, a doped well formed in the semiconductor substrate and has a given conductivity type, and a mesa having a side wall and extends out vertically from the semiconductor substrate. The mesa has a part with the given conductivity type and an equivalent doping concentration as the doped well. An integrated photodiode having an optoelectronically active part is formed by doping regions that form depletion layers, and are disposed partly in the mesa and partly in the doped well. An integrated light waveguide is disposed on the doped well and surrounds the mesa so that light is coupled into the optoelectronically active part both through the side wall of the mesa and also through the surface of the doped well.

In accordance with an added feature of the invention, the optoelectronically active part includes a first zone that is disposed at an end of the mesa facing away from the semiconductor substrate. The first zone has a doping of another conductivity type being opposite to the given conductivity type. The optoelectronically active part includes a second zone disposed in the doped well at the surface of the semiconductor substrate. The second zone has the given conductivity type and a doping in a higher concentration than the doped well. The optoelectronically active part also includes the part of the mesa.

In accordance with an additional feature of the invention, the first zone is made of a silicide.

In accordance with another feature of the invention, the first zone has a higher doping concentration in comparison with the doped well.

In accordance with a further feature of the invention, the optoelectronically active part includes a first zone having a doping that produces the given conductivity type, and a doping concentration that is higher in comparison to the doped well. A second zone having a doping producing another conductivity type that is opposite to the given conductivity, and a doping concentration that is higher in comparison to the doped well. The optoelectronically active part further contains the part of the mesa. The first zone and the second zone respectively are disposed on the side wall of the mesa as well as on the surface of the doped well.

In accordance with another added feature of the invention, the integrated light waveguide surrounds the mesa in an annular fashion.

In accordance with a concomitant feature of the invention, a vertical MOS field-effect transistor is provided. The transistor contains a further well having a first conductivity type and formed in the semiconductor substrate, and a further mesa extending out from the semiconductor substrate in a region of the further well. The further mesa has a further part with the first conductivity type. The transistor has a first doping region with a second conductivity type opposite to the first conductivity type and is disposed on the surface of the further well. The transistor has a second doping region with the second conductivity type and is disposed on an end of the further mesa facing away from the semiconductor substrate. A spacer formed of silicon is disposed on a side wall of the further mesa and is insulated against the further part of the further mesa.

Other features which are considered as characteristic for the invention are set forth in the appended claims.

Although the invention is illustrated and described herein as embodied in an optoelectronic microelectronic system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross-sectional view of a second specific embodiment of the vertical photodiode according to the invention; and FIG. 4 is a section view of a specific embodiment of a vertical MOS field-effect transistor for explaining the possibilities for manufacturing optoelectronic microelectronic systems having such transistors and vertical photodiodes according to the invention.

DESCRIPTION OF THE PREFERRED EMBODIMENTS

Figure 1:
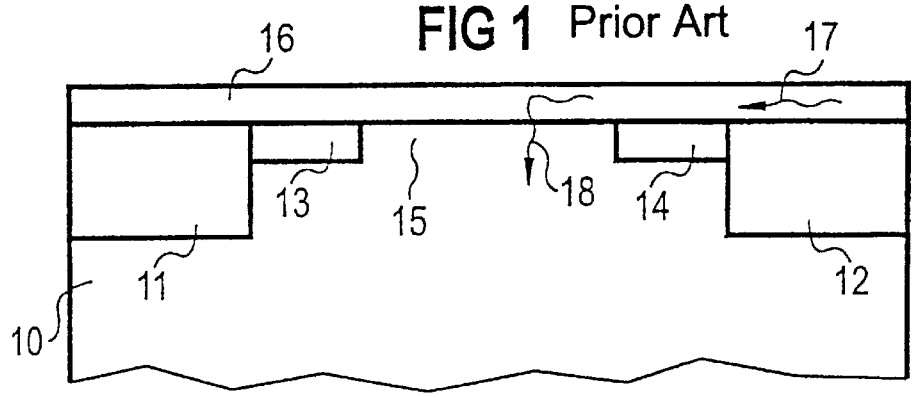
FIG. 1 is a diagrammatic, sectional view of a prior art photodiode.

Before beginning a detailed specification of the exemplary embodiments, it is to be noted that the figures of the drawing are only schematic representations. In order to simplify the representation, for example no actual size relations or edge roundings that result during the manufacture of insulating layers and doped zones are taken into account.

Referring now to the figures of the drawing in detail and first, particularly, to FIG. 1 thereof, there is shown a configuration of a known photodiode. In a silicon substrate 10 of a first conductivity type, having weak doping, e.g. of the p-conductivity type, trench insulators 11, 12 are provided for insulation against non-illustrated electronic functional units, such as the above-mentioned MOS transistors. The insulators 11, 12 can be what are known as shallow trench isolation (STI) regions with silicon dioxide. In a region between the trench insulators 11, 12, a zone 13 having the first conductivity type, i.e. for example the p-conductivity type, is provided, as well as a zone 14 of an opposite second conductivity type, i.e. for example the n-conductivity type. The zones 13, 14 have a higher doping concentration in comparison with the doping concentration of substrate 10. The expression "weak doping" used above for the substrate doping thus denotes a low doping concentration in comparison with the doping concentration of zones 13 and 14. A weakly doped zone 15, which in practice can also be designated an intrinsic zone, is thus located between the zones 13 and 14. If, as is standard, a low doping concentration is designated by a minus sign, and a high doping concentration is designated by a plus sign, then for the above conductivity types, given as examples, for the substrate 10 as well as the zones 13 and 14 an optoelectronically active diode part results having the zone sequence: $p^-$-zone 13, $p^-$-zone 15, and $n^+$-zone 14.

On the substrate 10 having the trench insulators 11, 12 and the zones 13, 14, 15, a light waveguide 16 is provided that can be made for example of silicon oxide nitride/silicon dioxide. From a light wave running in the light waveguide 16, indicated schematically by an arrow 17, light is coupled into the optoelectronically active diode part through a leaky wave coupling. In FIG. 1, the coupling of the light from light waveguide 16 into zone 15 is indicated by an arrow 18. Of course, light is also coupled in via the regions of the zones 13 and 14, but this is not shown separately. The coupled-in light generates charge bearers in the zone 15, which in turn generates the diode photocurrent.

A photodiode of the type explained above represents a lateral, or planar, diode. In order to enable realization of a good luminous efficacy, and thus a larger photocurrent, the surface area of the optoelectronically active diode part must be as large as possible, seen in the lateral direction. However, this results in that such planar photodiodes in an integrated system require a comparably large chip surface area, which has an adverse effect on the integration density. For large-scale-integrated systems, the tendency is towards ever-smaller structures, for example MOS transistors having ever-smaller channel lengths. The chip surface obtained in this way is then at least partially again destroyed through planar photodiodes. This is in particular also an economic disadvantage, because chip surface is an essential cost factor.

Figure 2A:
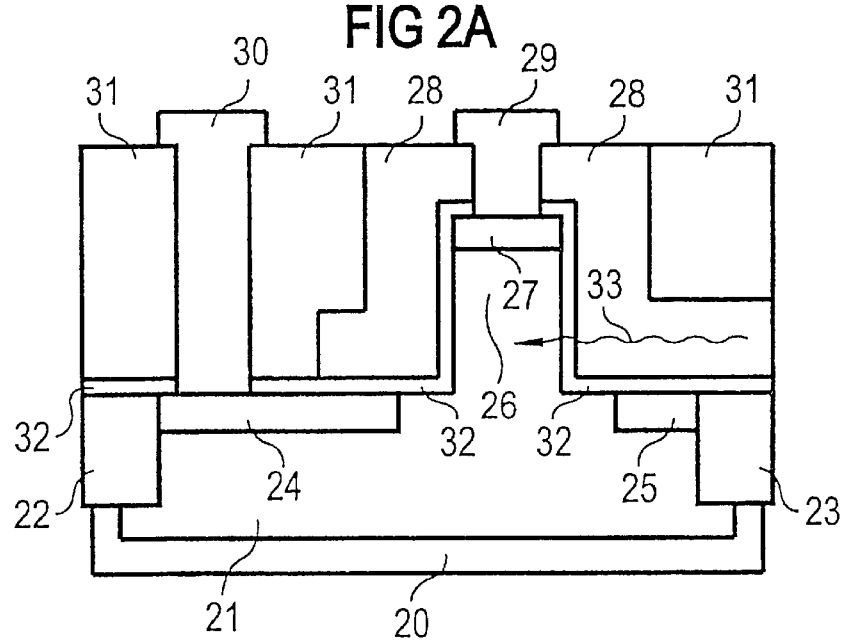
FIG. 2A is a cross-sectional view of a first specific embodiment of a vertical photodiode according to the invention.

According to the invention and as shown in FIG. 2A, in a silicon substrate 20 a region 21 having one conductivity type, preferably the n-conductivity type, is fashioned by a well. For insulation against further functional units present in a microelectronic system, such as MOS field-effect transistors, trench insulators 22, 23 are provided in the substrate 20 in the form of STI regions. In addition, zones 24, 25 of the one conductivity type, having doping concentrations that are higher in relation to the doping concentration of well region 21, are provided in the substrate 20 between the trench insulators 22, 23. In comparison to the well region 21 having the n-conductivity type, the zones 24, 25 have $n^+$-conductivity type.

Essential for the formation of a vertical photodiode is the formation of a mesa 26 that is prepared from the substrate 20 and stands vertically thereon, therefore having the same conductivity type and the same doping concentration as the well region 21. In the mesa 26, on a side facing away from the well region 21 a zone 27 is provided having the opposite conductivity type in relation to the conductivity type of the well region 21, and having a comparatively higher doping concentration. Again assuming the well region 21 has the n-conductivity type, the zone 27 has a $p^+$-conductivity type.

In the exemplary embodiment specified so far, the optoelectronically effective diode part is thus formed by the zones 24, 25 (this can also be a single contiguous zone), a zone of the mesa 26 underneath the zone 27, and the zone 27. If it is assumed that the well region 21 can be regarded as an intrinsic region, what is concerned is thus a PIN diode structure.

In a modified specific embodiment, a silicide layer can also be used instead of the p+ zone 27, resulting in a Schottky diode structure.

In both cases, a depletion layer is thus formed by the zone or layer 27.

The mesa 26 is surrounded by a light waveguide 28, which, as indicated above, can be made of silicon oxide nitride/silicon dioxide. The light waveguide 28 is provided on the substrate 20, preferably on an optical melioration layer 32, on an oxide. The coupling of the light from the light waveguide 28 into the optoelectronically active diode part in the region of the zone of mesa 26 underneath the zone 27 is indicated schematically by an arrow 33.

The photodiode structure is completed by electrical contacts 29 and 30 for the zone 27 and the zones 24 or 25. Finally, a passivation layer 31 is provided, which can be an oxide and/or a nitride.

In a photodiode of the type described above, it is essential to the invention that the vertical mesa 26, and thus the vertically standing optoelectronically active diode part, is surrounded by the light waveguide 28; i.e., the light waveguide 28 runs parallel to the mesa 26 and therefore also to the optoelectronically active diode part. Light is thus coupled into the optoelectronically active diode part via the vertical side wall of the mesa 26. In this way, a large light coupling surface can be realized with a comparatively small base surface of the mesa 26 in a lateral direction. With a small base surface, a higher luminous efficacy, and thus a larger photocurrent, can thus be achieved in relation to known planar structures according to FIG. 1. In addition, the desired large light coupling into the optoelectronically active diode part is decoupled from an undesired light coupling via the substrate 20, due to the light waveguide 28 that runs parallel to the longitudinal extension of the mesa 26.

Given a closed ring structure of the light waveguides 28 and the mesa 26 according to the layout view shown in FIG. 2B, there results an additional increase in the luminous efficacy, because light portions that are at first reflected are nonetheless later absorbed. This fact is indicated in FIG. 2B by a multiplicity of arrows 33 that schematically represent the light radiation.

Figure 2B:
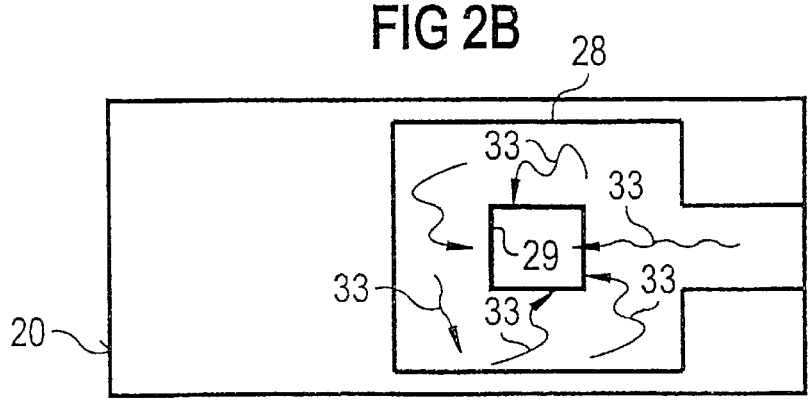
FIG. 2B is a plan view of a part of a layout of the vertical photodiode according to FIG. 2A.

In the exemplary embodiment of a vertical photodiode according to FIG. 3, in which elements identical to those in FIGS. 2A and 2B are provided with the same reference characters, as in the exemplary embodiment according to FIGS. 2A and 2B the substrate 20 is present having the well region 21, the trench insulators 22, 23, and the mesa 26. Differing from the exemplary embodiment according to FIGS. 2A and 2B, in this exemplary embodiment two highly doped zones 44, 45 having different conductivity types are provided, extending from the well region 21 underneath the mesa 26, along the edge thereof. If it is again assumed that well region 21 is of the n-conductivity type, then for example the zone 44 has $n^+$ conductivity type and the zone 45 has $p^{30}$ -conductivity type. In the exemplary embodiment as well, the mesa 26 is surrounded, preferably in annular fashion, by a light waveguide 47. From the light waveguide 47, light is likewise coupled in via the vertical side wall of the mesa 26, which is indicated by an arrow 52. This again results in the advantageous effects already explained on the basis of the exemplary embodiment according to FIGS. 2A and 2B.

The photodiode according to FIG. 3 is completed by electrical contacts 48, 49 for the zones 44, 45, as well as passivation layers 51.

Inventive photodiodes of the type explained above are advantageously suitable for integration into integrated circuits having known vertical MOS field-effect transistors. Such a transistor is shown schematically in FIG. 4. It is likewise constructed on a substrate 60 having a well region 61, which in the case of an n-channel MOS transistor is of the p-conductivity type. Insulation against further functional units in an integrated circuit is formed by trench insulators 62, 63 (STI regions). In the well region 61, a contiguous zone 64 is provided that has a conductivity type opposite to the conductivity type of the well region and that has a comparatively higher doping concentration. If the well region has the p-conductivity type, then the zone 64 has $n^+$-conductivity type. In a mesa 65, on its side facing away from well region 61 a zone 66 is provided that, given the conductivity types indicated above for the well region 61, the zone 64, and the mesa 65, has the $n^+$-conductivity type. The transistor construction is completed by a spacer 67 that is made of polysilicon or amorphous silicon and is insulated from the mesa substrate, contacts 68, 69 for the zones 64, 66, and passivation layers 70.

It is to be noted that for a p-channel transistor, the above-indicated conductivity types for the well region 61, the zone 64, the mesa 65, and the zone 66 are reversed.

As can be seen from a comparison of FIGS. 2A, 2B, 3, and 4, the inventive construction of vertical photodiodes is particularly well-suited for integration into a CMOS process. For example, in the integration of optoelectronic microelectronic systems having MOS transistors and photodiodes in vertical construction, it is possible to reduce the number of metallization layers for electrical connections and terminals if photodiodes operate as receivers in optical transmission paths on a chip. In addition, through the use of self-adjustment technologies, e.g. a spacer technology, it is additionally possible to increase the integration levels if spacer thicknesses are used that are below the lithographic minimal width.

If, as an alternative to vertical MOS transistors having a mesa structure according to FIG. 4, ring transistors or bar transistors are integrated together with vertical photodiodes, an "active" improvement of the electrical properties is possible. In particular, parasitic bipolar effects and short-channel effects are avoided.

The individual process steps in the integration of the inventive optoelectronic microelectronic systems are of a conventional type. Thus, in particular according to an STI process for manufacturing the trench insulators, after well implantations and, if necessary, an additional implantation for the manufacture of the zone 27 according to FIG. 2A, the manufacture of a nitride mask for the formation of the mesas is important, because the channel length of MOS transistors, as well as the height of the path region of photodiodes that are to be transilluminated, is determined by the height of the mesas. The overall surface of the photodiodes is thereby determined by the height of the mesas and the width thereof in the lateral direction on the substrate. Gate oxides, gate polysilicon, or else metallic gate materials, are grown or deposited in the standard manner, whereby polysilicon gates are structured using a mask that can also be used to protect the side walls of photodiodes according to FIGS. 2A and 2B. Source and drain regions of MOS transistors, as well as doped zones of photodiodes, can be manufactured using implantation techniques. Oxidic melioration layers for photodiodes, such as the layers 32 and 50 according to FIGS. 2A, 2B and FIG. 3, can be applied separately if necessary. Light waveguides are applied, of a material having a suitable index of refraction, and are structured by use of a mask. Finally, passivation layers are applied, and the processes such as contact hole etching, silicidization, and metallization are carried out. A silicidization takes place if, in place of the doped zone 27 according to FIG. 2A, a silicide layer is applied so as to form a Schottky diode. Besides silicon, compound semiconductors can also be used as optoelectronic materials.

We claim:

1. An optoelectronic microelectronic system, comprising:
    a semiconductor substrate having a surface;
    a doped well formed in said semiconductor substrate and having a given conductivity type and a surface;
    a mesa having a side wall and extending out vertically from said semiconductor substrate, said mesa having a part with said given conductivity type and an equivalent doping concentration as said doped well;
    an integrated photodiode having an optoelectronically active part formed by doping regions that form depletion layers, and disposed partly in said mesa and partly in said doped well; and
    an integrated light waveguide disposed on said doped well and surrounding said mesa so that light is coupled into said optoelectronically active part both through said side wall of said mesa and also through said surface of said doped well.

2. The optoelectronic microelectronic system according to claim 1, wherein:
    said optoelectronically active part includes a first zone that is disposed at an end of said mesa facing away from said semiconductor substrate, said first zone having a doping of another conductivity type being opposite to said given conductivity type;
    said optoelectronically active part includes a second zone disposed in said doped well at said surface of said semiconductor substrate, said second zone having said given conductivity type and a doping in a higher concentration than said doped well; and
    said optoelectronically active part includes said part of said mesa.

3. The optoelectronic microelectronic system according to claim 2, wherein said first zone is made of a silicide.

4. The optoelectronic microelectronic system according to claim 2, wherein said first zone has a higher doping concentration in comparison with said doped well.

5. The optoelectronic microelectronic system according to claim 1, wherein said optoelectronically active part includes:
    a first zone having a doping that produces said given conductivity type, and having a doping concentration that is higher in comparison to said doped well;
    a second zone having a doping producing another conductivity type that is opposite to said given conductivity, and having a doping concentration that is higher in comparison to said doped well; and
    said part of said mesa;
    said first zone and said second zone respectively disposed on said side wall of said mesa as well as on said surface of said doped well.

6. The optoelectronic microelectronic system according to claim 1, wherein said integrated light waveguide surrounds said mesa in an annular fashion.

7. The optoelectronic microelectronic system according to claim 1, further comprising:
    a vertical MOS field-effect transistor containing:
    a further well having a first conductivity type and formed in said semiconductor substrate, said further well having a surface;
    a further mesa extending out from said semiconductor substrate in a region of said further well, said further mesa having a further part with said first conductivity type;
    a first doping region having a second conductivity type opposite to said first conductivity type and disposed on said surface of said further well;
    a second doping region having said second conductivity type and disposed on an end of said further mesa facing away from said semiconductor substrate; and
    a spacer formed of silicon and disposed on a side wall of said further mesa and insulated against said further part of said further mesa.

8. An optoelectronic microelectronic system, comprising:
    a vertical MOS field-effect transistor containing:
        a semiconductor substrate having a surface;
        a well having a first conductivity type and formed in said semiconductor substrate, said well having a surface;
        a mesa extending out from said semiconductor substrate in a region of said well, said mesa having a part with said first conductivity type;
        a first doping region having a second conductivity type opposite to said first conductivity type and disposed on said surface of said well;
        a second doping region having said second conductivity type and disposed on an end of said mesa facing away from said semiconductor substrate; and
        a spacer formed of silicon and disposed on a side wall of said mesa and insulated against said part of said mesa.

* * * * *